United States Patent
Yeh et al.

(10) Patent No.: US 7,529,128 B2
(45) Date of Patent: *May 5, 2009

(54) INTEGRATED CODE AND DATA FLASH MEMORY

(75) Inventors: Chih Chieh Yeh, Taipei (TW); Wen Jer Tsai, Hualian (TW); Tao Cheng Lu, Kaoshing (TW); Chih Yuan Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/617,613

(22) Filed: Dec. 28, 2006

(65) Prior Publication Data

US 2007/0103991 A1 May 10, 2007

Related U.S. Application Data

(63) Continuation of application No. 10/815,370, filed on Apr. 1, 2004, now Pat. No. 7,158,411.

(51) Int. Cl.
G11C 11/34 (2006.01)

(52) U.S. Cl. .............................. 365/185.03; 365/185.11; 365/185.18; 365/185.27; 365/185.28; 365/185.29; 365/185.33

(58) Field of Classification Search ............ 365/185.03, 365/185.11, 185.18, 185.27, 185.28, 185.29, 365/185.33
See application file for complete search history.

(56) References Cited

U.S. PATENT DOCUMENTS

| | | | | |
|---|---|---|---|---|
| 5,293,331 A | * | 3/1994 | Hart et al. | 365/185.27 |
| 5,699,298 A | * | 12/1997 | Shiau et al. | 365/185.18 |
| 5,815,441 A | * | 9/1998 | Kobatake | 365/185.29 |
| 5,937,424 A | * | 8/1999 | Leak et al. | 365/185.33 |
| 6,222,767 B1 | | 4/2001 | Kendall et al. | |
| 6,229,732 B1 | * | 5/2001 | Lin et al. | 365/185.18 |
| 6,490,196 B1 | * | 12/2002 | Hsu et al. | 365/185.18 |
| 6,512,700 B1 | | 1/2003 | McPartland et al. | |
| 6,591,327 B1 | | 7/2003 | Briner et al. | |
| 6,671,209 B2 | * | 12/2003 | Lin et al. | 365/185.29 |
| 6,771,541 B1 | | 8/2004 | Park | |
| 6,778,442 B1 | | 8/2004 | Hamilton et al. | |

(Continued)

FOREIGN PATENT DOCUMENTS

JP 200123382 1/2001

*Primary Examiner*—Trong Phan
(74) *Attorney, Agent, or Firm*—Kenta Suzue; Haynes Beffel & Wolfeld LLP (57) ABSTRACT

A memory architecture for an integrated circuit comprises a first memory array configured to store data for one pattern of data usage and a second memory array configured to store data for another pattern of data usage. The first and second memory arrays comprise charge storage based nonvolatile memory cells having substantially the same structure in both arrays. A first operation algorithm adapted for example for data flash applications is used for programming, erasing and reading data in the first memory array. A second operation algorithm adapted for example for code flash applications is used for programming, erasing and reading data in the second memory array, wherein the second operation algorithm is different than the first operation algorithm. Thus, one die with memory for both code flash and data flash applications can be easily manufactured using a simple process, at low cost and high yield.

64 Claims, 4 Drawing Sheets

U.S. PATENT DOCUMENTS 6,826,084 B1 * 11/2004 Wong .................... 365/185.18
2004/0136240 A1    7/2004 Zheng et al.
2005/0226054 A1   10/2005 Yeh et al.

* cited by examiner

DATA PROGRAM
(LEFT BIT)

FIG. 5B

DATA PROGRAM
(RIGHT BIT)

FIG. 5C

DATA ERASE
(BOTH BITS)

FIG. 6A

CODE PROGRAM
(LEFT BIT)

FIG. 6C

CODE ERASE
(LEFT BIT)

FIG. 6B

CODE PROGRAM
(RIGHT BIT)

FIG. 6D

CODE ERASE
(RIGHT BIT)

FIG. 7

INTEGRATED CODE AND DATA FLASH MEMORY

BACKGROUND OF THE INVENTION

1. Field of the Invention

The present invention relates to electrically programmable and erasable non-volatile memory and integrated circuits including such memory, and more particularly to architectures for such devices supporting both code and data flash.

2. Description of Related Art

Electrically programmable and erasable non-volatile memory technologies, including flash memory, are being adapted to many applications. Technologies based upon floating gates like standard EEPROM, or localized charge trapping structures like oxide-nitride-oxide memory cells known in various architectures as SONOS cells and NROM, are typically programmable and erasable many times. Flash memory technologies can be differentiated according to their use for storing data or code. Thus, market segments for so-called data flash and so-called code flash have developed.

Data flash has several characteristics: (1) high density storage; (2) fast page program speed (for example: 16k bit per page); (3) fast page read speed. Data flash often is used for mass storage applications, where the data stored may include image files produced using digital cameras, files and directory structures in flash cards, audio files like MP3 files, and files of digital samples from analog signals, and other storage applications in which a majority of the program, erase and read transactions involve patterns of data usage involving relatively large data sets. Three representative memory architectures that can serve the data flash market, include: NAND (Toshiba/Samsung), AG-AND (Renesas) and PHINES (Macronix; see Yeh, et al., PHINES: a Novel Low Power Program/Erase, Small Pitch, 2-Bit per Cell Flash Memory Cell, 2002 IEDM, p. 931-934; and U.S. Pat. No. 6,690,601). Among the just listed alternatives, the floating gate based NAND architecture might be considered the current mainstream architecture for data flash.

Code flash has several characteristics, including (1) fast byte (8 bits) program speed; and (2) fast random memory access time for single bit for sensing. Code flash is often used for storage of data like computer instructions and parameters for devices like personal computers and mobile phones, in which a majority of the program, erase and read transactions involve patterns of data usage involving relatively small data sets, like updates to instructions and subroutine segments within computer programs and setting and changing values in parameter sets. Three representative memory architectures that can serve the code flash market, include: NOR (Intel, AMD; see U.S. Pat. No. 6,370,062), DINOR, split-gate and NROM (See, U.S. Pat. No. 5,768,192). Among the just listed alternatives, the floating gate based NOR architecture might be considered the current mainstream architecture for code flash. Although it has been proposed to use NROM memory to store both code and data, the operation algorithm used for NROM is considered more suitable to use as code flash.

In general, data flash and code flash are differentiated by operation algorithms for programming, erasing and reading the data, and by the memory cell structures which axe adapted to the operation algorithms. Thus, integration of conventional flash memory technology for both code and data flash purposes on a single chip has not been practical. Accordingly, existing technology relies upon two chips, one for code flash and one for data flash, to serve these functions. The cost of systems in terms of space on the board, the number of chips, and difficulty in design is high as a result.

Accordingly, it is desirable to provide systems and methods for providing integrated flash memory on a single chip for both code and data storage.

SUMMARY OF THE INVENTION

The present invention provides a memory architecture for an integrated circuit, a method for manufacturing an integrated circuit, and a method for operating an integrated circuit, where the integrated circuit comprises a first memory array configured to store data for one pattern of data usage and a second memory array configured to store data for another pattern of data usage. The first and second memory arrays comprise nonvolatile memory cells, and more preferably charge storage based nonvolatile memory cells. A first operation algorithm adapted in preferred embodiments for data flash applications is used for programming, erasing and reading data in the first memory array. A second operation algorithm adapted in preferred embodiments for code flash applications is used for programming, erasing and reading data in the second memory array, wherein the second operation algorithm is different than the first operation algorithm. In some embodiments of the invention, the memory cells in the first and second arrays have substantially the same structure, so that one die with memory for both code flash and data flash applications can be easily manufactured using a simple process, at low cost and high yield.

According to embodiments of the present invention, the nonvolatile memory cells in at least one of the first and second memory arrays, and in more preferred embodiments in both of the first and second memory arrays, comprise a first channel terminal acting as a source or drain, a channel and a second channel terminal acting as a drain or source in the semiconductor substrate. A charge storage structure overlies the channel, and typically part of the first and second channel terminals. The charge storage structure in some embodiments comprises a first dielectric layer, a localized charge trapping structure such as a layer of silicon nitride, and a second dielectric layer. In one particular embodiment, the first dielectric layer acts as a tunnel dielectric adapted for both the first and second operation algorithms. In another embodiment, the first and the second dielectric layers are configured as tunnel dielectrics. For example, the tunnel dielectric in one embodiment comprises silicon dioxide or silicon oxynitride having a thickness supporting band-to-band tunneling induced hole injection and channel hot electron injection, and the second dielectric is configured with a thickness supporting E-field assisted (Fowler-Nordheim) tunneling from the gate to the charge trapping structure. In the other embodiments, one or both of the first and the second dielectric layers are configured as charge blocking dielectrics. For example, the blocking dielectric in one embodiment comprises silicon dioxide or silicon oxynitride having a thickness to prevent the stored charges in the charge trapping layer from escaping out during storage period, which can improve data retention. Other types of nonvolatile memory cell structures, including for example floating gate type cells and localized charge trapping type cells, may be used in other embodiments of the invention.

In yet other embodiments of the present invention, at least one of the first and second memory arrays is adapted to store two or more bits per memory cell.

The present invention is also embodied by integrated circuits having system on a chip configurations, such as a single integrated circuit comprising first and second memory arrays configured for data flash and code flash applications, respectively, a user programmable processor, and SRAM memory.

According to one aspect of the invention, a method for manufacturing an integrated circuit device is provided. The method for manufacturing includes providing a semiconductor substrate and forming on the substrate a first memory array configured for pattern of data usage, such as for data flash applications, and a second memory array configured for another pattern of data usage, such as code flash applications. Also, controller circuitry is provided on the semiconductor substrate to read, program and erase data in the first and second memory arrays according to first and second operation algorithms, which are different from one another. According to embodiments of the method for manufacturing, the step of forming the first memory array and forming the second memory array comprises using a set of process steps which results in simultaneously forming a first plurality of bitlines for the first memory array and a second plurality of bitlines for the second memory array and using a set of process steps which results in simultaneously forming a first plurality of wordlines in the first memory array and a second plurality of wordlines in the second memory array. Also in embodiments of the present invention, the charge storage structures in the first and second memory arrays are formed using a set of process steps which results in simultaneously by providing a first dielectric layer, a charge storage structure, and a second dielectric layer in both memory arrays. Methods for manufacturing according to various embodiments of the present invention provide a number of variations of the integrated circuit as summarized above.

Yet another aspect of the present invention provides a method for storing data for data flash applications and data for code flash applications on a single integrated circuit. According to an embodiment of the invention, the method comprises addressing a first memory array comprising nonvolatile memory cells on the integrated circuit to read, program and erase data using a first operation algorithm, and addressing a second memory array comprising nonvolatile memory cells on the integrated circuit to read, program and erase data according to a second operation algorithm. In embodiments of the invention, the nonvolatile memory cells in the first and second memory arrays have substantially the same structure. The first and second operation algorithms differ from one another, so that the first and second memory arrays may be more efficiently utilized for different patterns of data usage. As described above, the first and second operation algorithms are adapted in a preferred embodiment for data flash applications and code flash applications respectively.

Embodiments of the present invention include a first operation algorithm adapted for data flash applications in which programming is accomplished using band-to-band tunneling induced hole injection, and erasing using E-field assisted electron injection typical of PHINES type memory. In some embodiments of the invention, the second operation algorithm adapted for code flash applications comprises programming using channel hot electron injection, and erasing using band-to-band tunneling induced hole injection typical of NROM type memory.

The present invention provides a high density integrated circuit storage device employing a memory cell, for example a localized charge trapping based memory cell suitable for both PHINES type operation and NROM type operation, configured in first and second arrays adapted for different patterns of memory usage, including code flash and data flash applications. The invention also includes embodiments applying 2-bit per cell memory architectures in one or both of the first and second memory arrays.

Other aspects and advantages of the present invention can be seen on review of the drawings, the detailed description and the claims, which follow.

DETAILED DESCRIPTION

A detailed description of embodiments of the present invention is provided with reference to FIGS. 1-7.

Figure 1:
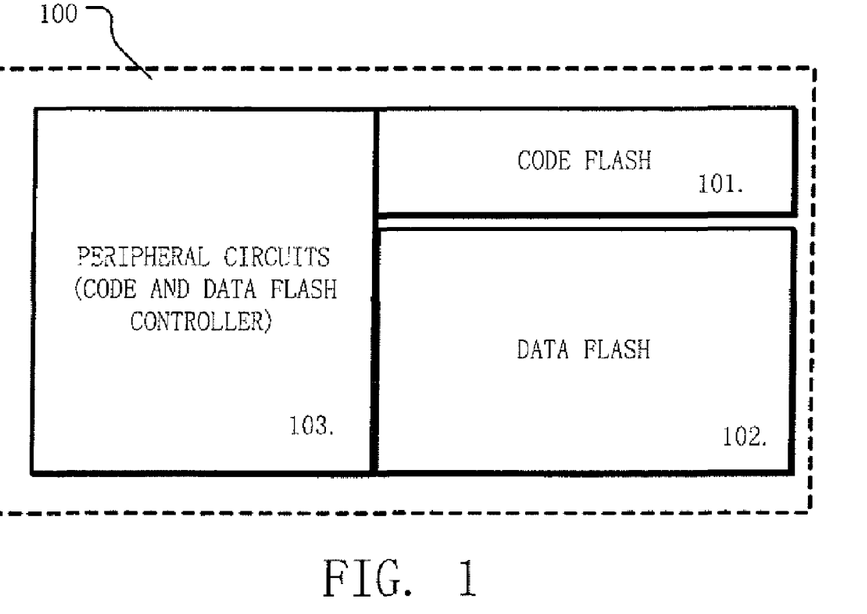
FIG. 1 is a simplified block diagram of an integrated circuit according to the present invention.

FIG. 1 illustrates the basic concept of the present invention. In particular, an integrated circuit 100 comprises a first memory array 101 adapted for code flash applications, and a second memory array 102 adapted for data flash applications. Peripheral circuits 103 on the integrated circuit include a code and data flash controller which execute first and second operation algorithms which are adapted for the patterns of data usage corresponding with code flash and data flash applications. In preferred embodiments, the memory cells in the first array 101 and the second array 102 have substantially the same structure, while the first and second operation algorithms differ to efficiently support different patterns of data usage within a single integrated circuit device.

Figure 2:
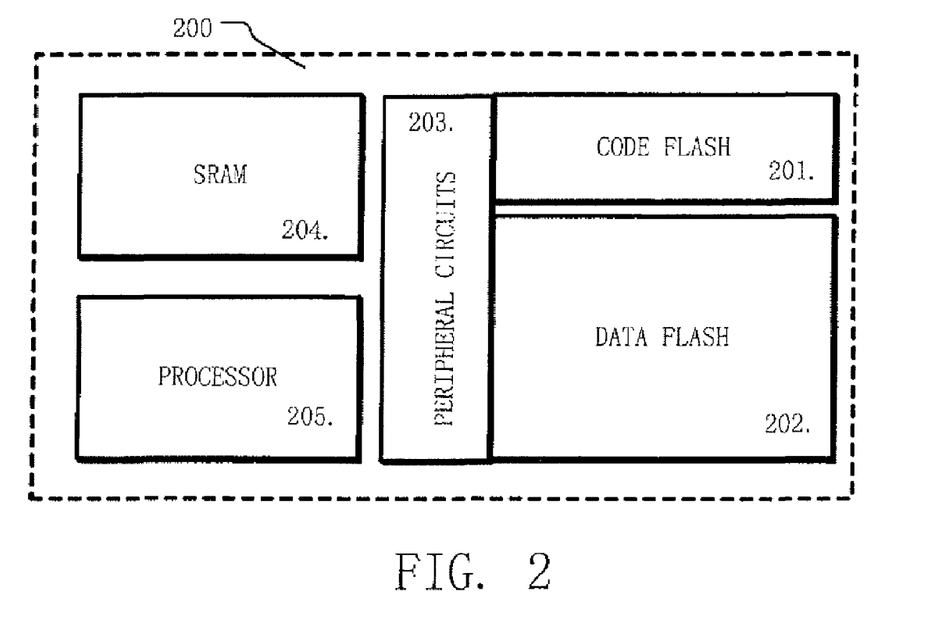
FIG. 2 is a simplified block diagram of an integrated circuit according to the present invention for a system on a chip embodiment.

The integrated circuit shown in FIG. 1 may include other components not shown in figure. For example, FIG. 2 illustrates a "system on a chip SOC" integrated circuit 200, having a first memory array 201 adapted for code flash applications, a second memory array 202 adapted for data flash applications, and peripheral circuits 203 including a code and data flash controller as described with respect to FIG. 1. The integrated circuit 200 also includes SRAM memory 204 and a user programmable processor 205, like a general-purpose processor or a digital signal processor. Additional components (not shown) such as data and instruction buses, input/output communication circuitry, field programmable logic arrays and so on can be formed on the same chip. In other embodiments, the controller for the first and second memory arrays can be implemented using the processor 205, special-purpose logic, or a combination of the two.

Figure 3:
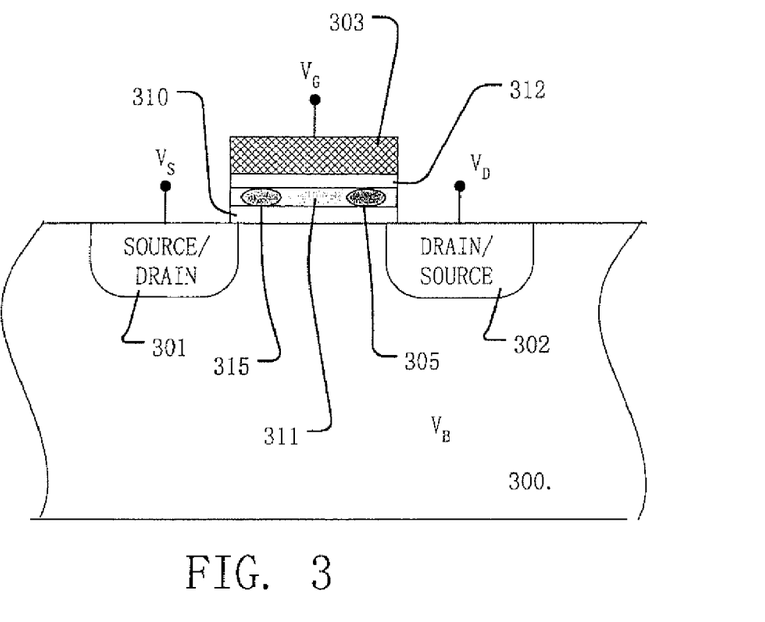
FIG. 3 is a simplified diagram of a localized charge trapping memory cell that can be used for both code and data flash.

FIG. 3 illustrates a memory cell structure suitable for both a first and second memory arrays according to the present invention. The memory cell structure, formed in a semiconductor substrate 300 includes a first channel terminal 301 which acts as a source or drain, a second channel terminal 302 which act as a drain or source, and a channel region between the first channel terminal 301 and a second channel terminal

302. A charge storage structure comprises a first dielectric layer 310, a localized charge trapping structure 311, and a second dielectric layer 312 which overlies the channel region, and partially overlaps the first channel terminal 301 and the second channel terminal 302. A gate structure 303 overlies charge storage structure. The first dielectric layer in some embodiments has a thickness greater than about 1 mm and less than about 20 nm, and more preferably about 6 or 7 nm. The second dielectric layer has similar dimensions in some embodiments.

The first channel terminal 301 is coupled to a voltage $V_S$ via a bitline, the second channel terminal 302 is coupled to a voltage $V_D$ via another bitline, and the gate structure 303 is coupled to a voltage $V_G$ via a wordline in typical array embodiments. The substrate in which the channel region is formed is coupled to a voltage $V_B$. The operation algorithms for the memory arrays apply voltages or otherwise bias these terminals for program, arrays and read operations.

The charge storage structure comprises a layer of silicon nitride in the illustrated embodiment extending the width of the channel, which stores data by localized charge trapping. In other embodiments, charge trapping material other than silicon nitride may be used, such as $Al_2O_3$, $HfO_x$, $ZrO_x$, or other metal oxide can be used to form memory cells. Also, in other embodiments, the charge trapping material can be configured so that it does not extend the entire width of the channel, including for example a pocket of charge trapping material adjacent the first channel terminal 301, and a pocket of charge trapping material adjacent the second channel terminal 302.

As illustrated heuristically in FIG. 3, localized charge trapping results in storage of charge in one of region 305 and region 315 for single bit storage, and in both regions 305, 315 for storage of two bits per cell. Charge is moved into and out of the localized charge trapping regions in the memory cells of first and second memory arrays according to first and second operation algorithms adapted different patterns of data usage, as explained farther below. In other embodiments, the charge storage structure may comprise a floating gate.

The memory cell structure illustrating FIG. 3 is used in both first and second memory arrays on a single integrated circuit in preferred embodiments of the invention. In other embodiments, memory cell structures in the first memory array may be different than in the second memory array. For example, slight differences which do not unreasonably complicate manufacturing of the memory arrays on a single integrated circuit, such as variations in the thickness or type of the first and or second dielectric layer, variations in the channel length or channel width for the memory cells, variations in the width of bitlines, or variations in other parts of the memory cell can be utilized in the first and second memory arrays.

Figure 4:
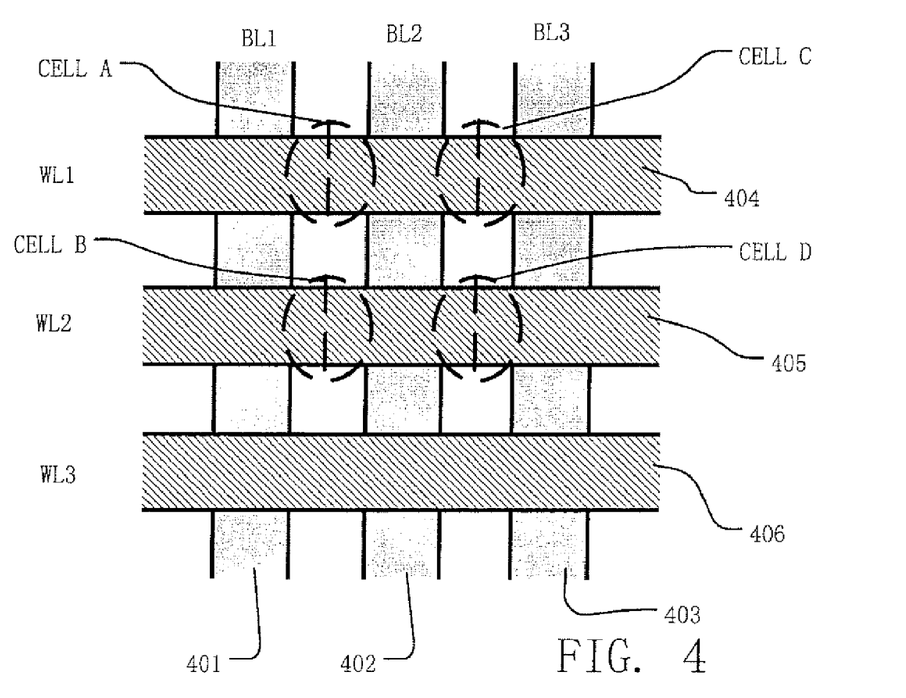
FIG. 4 is a layout diagram for an array of memory cells, like that of FIG. 3, usable for both code and data flash.

FIG. 4 is a layout view of an array of memory cells, such as those illustrated FIG. 3. In layout, the memory array shown in FIG. 4 includes bitlines BL1-BL3 which comprise buried diffusion lines 401, 402, 403 arranged substantially parallel to one another in first direction. A charge storage structures (not shown) are formed over substrate between the buried diffusion bitlines. Word lines WL1-WL3 comprising conductive strips 404, 405, 406, overlie the charge storage structures, and are arranged substantially parallel to one another in a second direction which is orthogonal to the first direction. The memory cells in the array are formed using triple well technology, or other technology, to allow biasing of the channel regions in the substrate, as required for operation algorithms in some embodiments. Thus for example, the first and second memory arrays are divided into sets of cells, (wordlines, sectors, array, etc.) having numbers and arrangements adapted to the operation algorithm selected. Each set is formed in an isolated p-type well. The isolated p-type well is formed within a deep n-type well in a p-type substrate. In this triple well configuration, the isolated p-type wells can be biased as needed for operation of the memory array. In some embodiments, the array layout comprises isolation structures, such as STI (shallow trench isolation) isolation. In the some embodiments, the array layout comprises contacts and metal wires for interconnections.

Memory cells identified as CELL A, CELL B, CELL C and CELL D in FIG. 4, result from sets of process steps by which the bitlines, charge storage structures and wordlines are formed. The memory cells are illustrated schematically with a vertical dividing line indicating two bits per cell storage. In other embodiments, one bit per cell might be stored. Yet other embodiments more than two bits per cell can be stored in nonvolatile memory cells according to the present invention.

As mentioned above, integrated circuits according to the present invention include a first memory array and a second memory array. In embodiments of the present invention, a set of process steps is used to form the first memory array and the second memory array, which results in simultaneous formation of a plurality of bitlines for the first memory array and a plurality of bitlines for the second memory array, and simultaneous formation of a plurality of wordlines for the first memory array and a plurality of wordlines for the second memory array. While forming the bitlines and the wordlines simultaneously according to a set of process steps, the sizes of the bitlines and the wordlines may be varied between the first and second memory arrays if desired with simple changes in layout dimensions of a mask, without changes in the set of process steps applied to form the first and second arrays. According to embodiments of the invention, array isolation structures and array partitions, are also simultaneously formed by a set of process steps, in the first and second arrays. The array isolation structure and partitions can be varied between the first and second arrays, without changes in the set of process steps in some embodiments.

In embodiments of the present invention, a set of process steps also results in simultaneous formation of the charge storage structures in both the first and second memory arrays, such that the memory cells in both arrays can be substantially the same. In other embodiments, the charge storage structures may vary slightly in process steps, allowing formation of memory cells with different thicknesses or compositions of dielectric layers for example.

Controllers for an integrated circuit having a first memory array and a second memory execute operation algorithms that are adapted for first and second patterns of data usage as discussed above. In one embodiment of the invention, the first and second patterns of data usage correspond with data flash applications and code flash applications respectively. First and second operation algorithms for one preferred embodiment of the invention are illustrated with respect to FIGS. 5A-5C and FIGS. 6A-6D. According to this embodiment, the memory cell structure is substantially the same in both the first and second memory arrays, as illustrated in FIG. 3. A representative first operation algorithm, adapted for patterns of data usage such as encountered in data flash applications, is illustrated in the Table 1, and corresponds with the operation algorithms typically applied for PHINES architectures.

TABLE 1

|  |  | Program (BTBT HH) | Erase (-Vg FN) | Read (Backward) |
|---|---|---|---|---|
| Right bit | Vg | -6 V | -7 V | 3 V |
|  | Vd | 5 V | F | 0 V |
|  | Vs | 0 V | F | 1.6 V |
|  | Vb | 0 V | 10 V | 0 V |
| Left Bit | Vg | -6 V | -7 V | 3 V |
|  | Vd | 0 V | F | 1.6 V |
|  | Vs | 5 V | F | 0 V |
|  | Vb | 0 V | 10 V | 0 V |

Figure 5A:
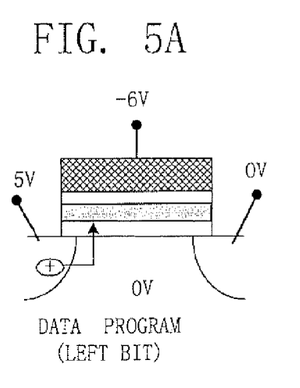
FIGS. 5A-5C illustrate representative program and erase processes for data flash operation of the memory cell of FIG. 3.
Figure 5B:
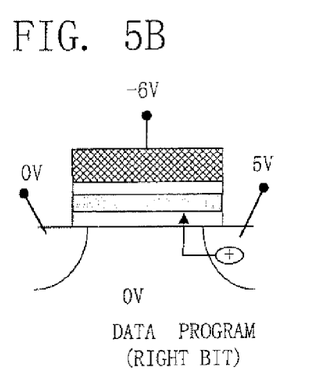
Figure 5C:
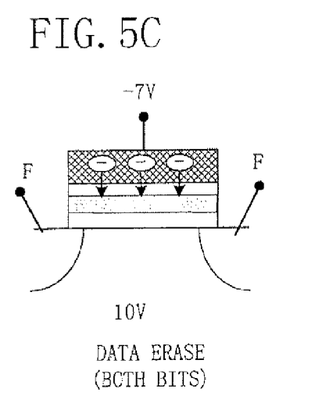

According to this first operation algorithm, programming is accomplished using band-to-band tunneling induced hot hole injection and erasing is accomplished using the negative gate voltage, E-field induced electron tunneling (also known as Fowler-Nordheim tunneling) which causes tunneling current from the gate to the charge trapping structure. Thus, as illustrated in FIG. 5A, a left bit is programmed by applying five volts to the source, zero volts to the drain, and minus six volts to the gate, while the substrate is grounded. This induces hot holes having sufficient energy to jump over the tunnel dielectric into the charge trapping structure on the left side of the memory cell. As illustrated in FIG. 5B, a right bit is programmed by applying five volts to the drain, zero volts to the source, and minus six volts to the gate, while the substrate is grounded. This induces hot holes having sufficient energy to jump over the tunnel dielectric into the charge trapping structure on the right side of the memory cell. FIG. 5C illustrates E-field assisted electron tunneling used for erase induced by relatively high negative bias on the gate, and relatively high positive bias on the substrate. Both bits in the memory cell are simultaneously erased in the illustrated example by applying 10 volts to the substrate, and minus seven volts to the gate, while both the source and the drain are floating. The two bits are read according to this operation algorithm using backward read operations, in which the memory cells are biased as illustrated in Table 1. Other program and erase techniques can be used in operation algorithms applied to the PHINES type memory cell, as described for example in U.S. Pat. No. 6,690,601. Other memory cells and other operation algorithms might also be used.

A representative second operation algorithm, adapted for patterns of data usage such as encountered in code flash applications, is illustrated in Table 2, and corresponds with the operation algorithm typically applied for two-bit per cell NROM architectures.

TABLE 2

|  | Right Bit | | | Left Bit | | |
|---|---|---|---|---|---|---|
|  | Vg | Vd | Vs | Vg | Vd | Vs |
| Program (CHE) | 11 V | 5 V | 0 V | 11 V | 0 V | 5 V |
| Erase (BTBT HH) | -3 V | 8 V | 0 V | -3 V | 0 V | 8 V |
| Read (Reverse) | 3 V | 0 V | 1.6 V | 3 V | 1.6 V | 0 V |

Figure 6A:
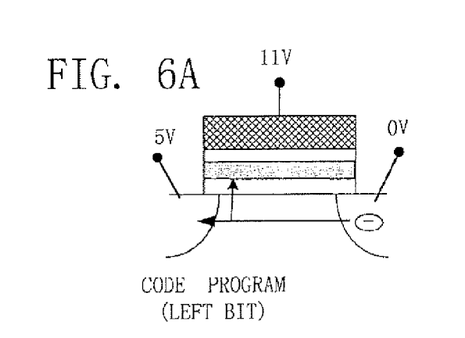
FIGS. 6A-6d illustrate representative program and erase processes for code flash operation of the memory cell of FIG. 3.
Figure 6B:
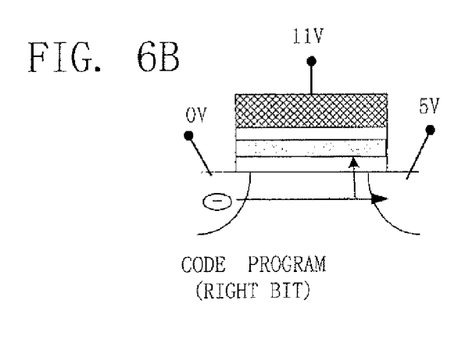
Figure 6C:
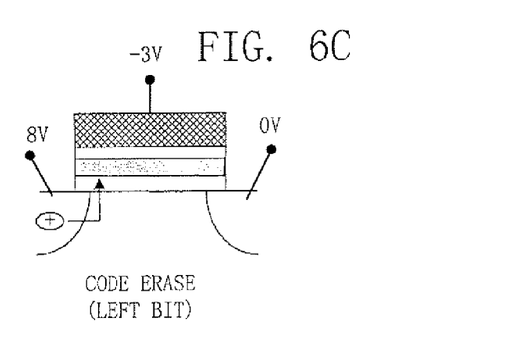
Figure 6D:
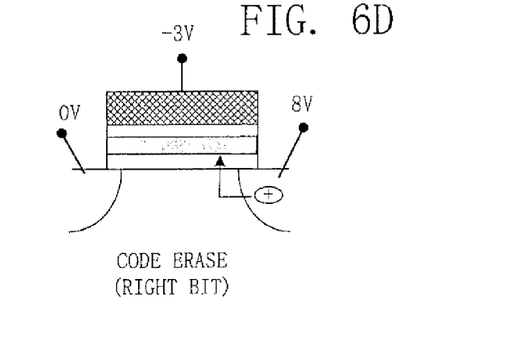

According to this second operation algorithm, programming is accomplished using channel hot electron injection, and erasing is accomplished using band-to-band tunneling induced hot hole injection. Thus, as illustrated in FIG. 6A, a left bit is programmed by applying five volts to the source, zero volts to the drain, and 11 volts to the gate. This induces hot electrons in the channel having sufficient energy to jump over the tunnel dielectric into the charge trapping structure on the left side of the memory cell. As shown in FIG. 6B, a right bit is programmed by applying five volts to the drain, zero volts to the source, and 11 volts to the gate. This induces hot electrons in the channel having sufficient energy to jump over the tunnel dielectric into the charge trapping structure on the right side of the memory cell. As shown in FIG. 6C, a left bit is erased by applying eight volts to the source, zero volts to the drain, and minus three volts to the gate. This causes band-to-band tunneling induced hot holes having sufficient energy to jump over the tunnel dielectric and neutralize electrons on the left side of the memory cell. Finally, as shown in FIG. 6D, a right bit is erased by applying zero volts to the source, eight volts to the drain, and minus three volts to the gate. This causes band-to-band tunneling induced hot holes having sufficient energy to jump over the tunnel dielectric and neutralize electrons on the right side of the memory cell. The two bits in the memory cells are read using reverse read operations, in which the memory cells are biased as illustrated in Table 2 according to this second operation algorithm. Other program and erase techniques can be used in operation algorithms applied to the NROM type memory cell. Other types of memory cells and operation algorithms might also be applied.

Figure 7:
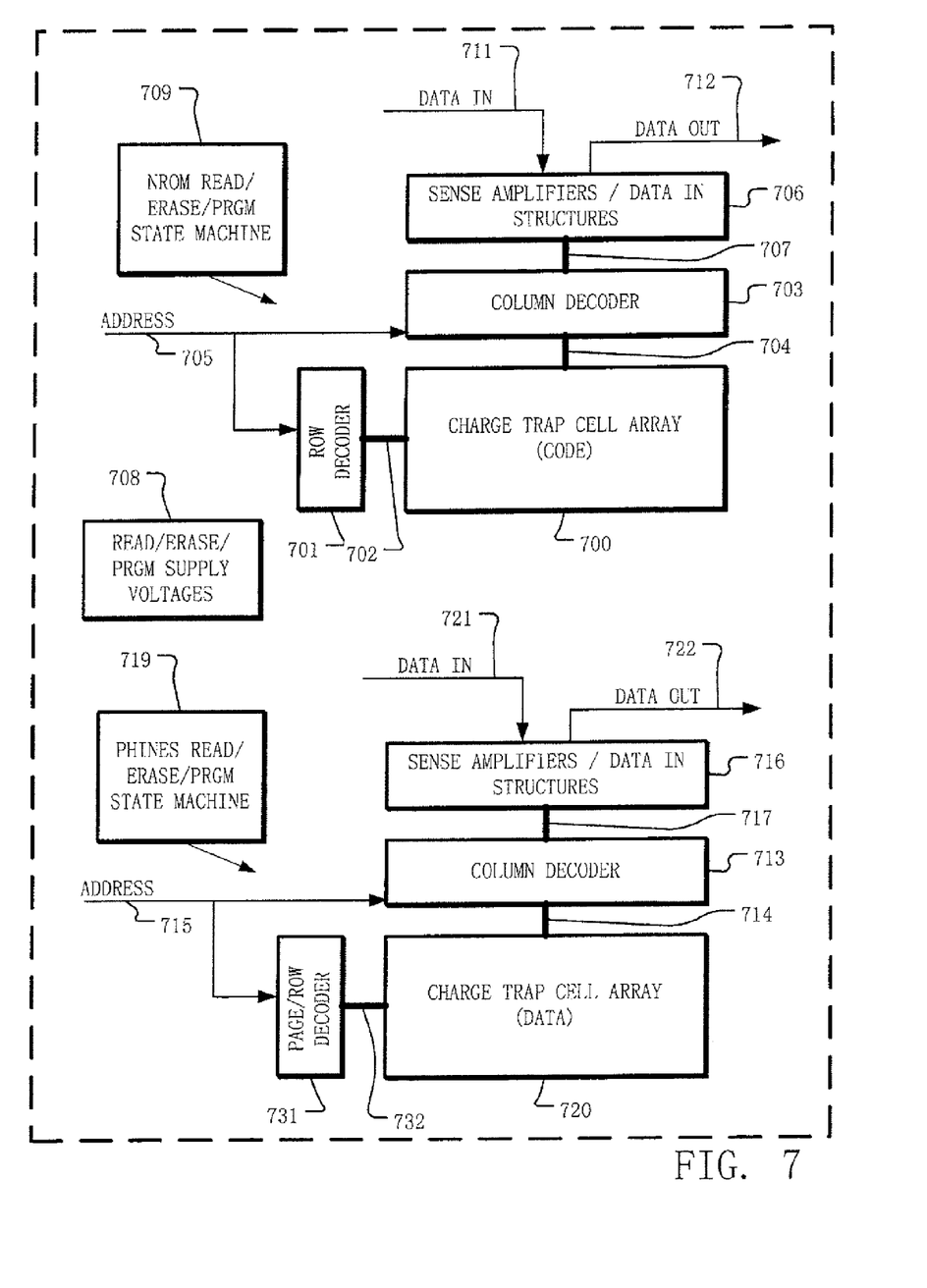
FIG. 7 is a more detailed diagram of an integrated circuit, including localized charge trapping memory cell arrays configured for code and data storage according to an embodiment of the present invention.

FIG. 7 is a simplified block diagram of an integrated circuit supporting code and data flash according to the present invention. The integrated circuit includes a memory array 700 implemented using localized charge trapping memory cells configured for code storage, applying a NROM-type operation algorithm as illustrated in Table 2. A row decoder 701 is coupled to a plurality of wordlines 702 arranged along rows in the memory array 700. A column decoder 703 is coupled to a plurality of bitlines 704 arranged along columns in the memory array 700. Addresses are supplied on bus 705 to column decoder 703 and row decoder 701. Sense amplifiers and data-in structures in block 706 are coupled to the column decoder 703 via data bus 707. Data is supplied via the data-in line 711 from input/output ports on the integrated circuit, or from other data sources internal or external to the integrated circuit, to the data-in structures in block 706. Data is supplied via the data out line 712 from the sense amplifiers in block 706 to input/output ports on the integrated circuit, or to other data destinations internal or external to the integrated circuit.

The integrated circuit also includes a memory array 720 implemented using localized charge trapping memory cells configured for data storage, applying a PHINES-type operation algorithm as illustrated in Table 1. A page/row decoder 731 is coupled to a plurality of wordlines 732 arranged along rows in the memory array 720. A column decoder 713 is coupled to a plurality of bitlines 714 arranged along columns in the memory array 720. Addresses are supplied on bus 715 to column decoder 713 and page/row decoder 731. Sense amplifiers and data-in structures in block 716 are coupled to the column decoder 713 via data bus 717. Data is supplied via the data-in line 721 from input/output ports on the integrated circuit, or from other data sources internal or external to the integrated circuit, to the data-in structures in block 716. Data is supplied via the data out line 722 from the sense amplifiers in block 716 to input/output ports on the integrated circuit, or to other data destinations internal or external to the integrated circuit.

Resources for controlling the reading, programming and erasing of memory cells in the code array 700 and the data array 720 are included on the chip. These resources include read/erase/program supply voltage sources (including for example charge pump circuits, voltage regulators, voltage dividers and the like) represented by block 708, the NROM-type state machine 709 configured for code flash type applications, and the PHINES-type state machine 719 configured for data flash type applications, which are coupled to the other circuitry on the integrated circuit, which participate in operation of the device.

The supply voltage sources 708 are implemented in various embodiments using charge pumps, voltage regulators, voltage dividers and the like as known in the art, for supplying various voltage levels, including negative voltages, used in the read, erase and program operations for the NROM-type and PHINES-type operation.

The NROM-type state machine 709 supports read, erase and program operations, including channel electron injection for programming and band-to-band tunneling induced hot hole injection for erase, according to this embodiment of the present invention. The PHINES-type state machine 719 supports read, erase and program operations, including band-to-band tunneling induced hot hole injection for programming and E-field assisted (Fowler-Nordheim) electron tunneling for erase, according to this embodiment of the present invention. The state machines 709, 719 can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the state machine.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device, comprising:
a processor in the integrated circuit device;
a random access memory in the integrated circuit device;
a semiconductor substrate in the integrated circuit device;
a first memory array on the substrate comprising charge storage, non-volatile memory cells, configured to store data for a first pattern of data usage in response to a first operation algorithm using a first charge movement process type with at least one of reading, programming, and erasing the first memory array;
a second memory array on the substrate comprising charge storage, non-volatile memory cells, configured to store data for a second pattern of data usage in response to a second operation algorithm using a second charge movement process type with at least one of reading, programming, and erasing the second memory array, wherein the first and second charge movement process types are different and, wherein the charge storage, non-volatile memory cells in the first memory array have a first cell structure, and wherein the charge storage, non-volatile memory cells in the second memory array have a second cell structure which is substantially the same as the first cell structure;
controller circuitry coupled to the processor, the random access memory, and the first and second memory arrays, including logic to read, program and erase data in the first memory array and in the second memory array according to the first and second operation algorithms.

2. The integrated circuit device of claim 1, wherein the charge storage, non-volatile memory cells in the first memory array respectively comprise a first channel terminal, a channel, and a second channel terminal in the substrate, a first dielectric layer, a charge trapping structure and a second dielectric layer overlying the channel, and a gate terminal.

3. The integrated circuit device of claim 1, wherein the charge storage, non-volatile memory cells in the first memory array and in the second memory array respectively comprise a first channel terminal, a channel, and a second channel terminal in the substrate, a first dielectric layer, a charge trapping structure and a second dielectric layer overlying the channel, and a gate terminal.

4. The integrated circuit device of claim 1, wherein the charge storage, non-volatile memory cells in the first memory array and in the second memory array respectively comprise a first channel terminal, a channel, and a second channel terminal in the substrate, a first dielectric layer, a charge trapping structure and a second dielectric layer overlying the channel, and a gate terminal, and wherein the charge trapping structure comprises at least one of silicon nitride, $Al_2O_3$, $HfO_x$, $ZrO_x$, or other metal oxide.

5. The integrated circuit device of claim 1, wherein the first cell structure has a first channel length, and the second cell structure has a second channel length different from the first channel length.

6. The integrated circuit device of claim 1, wherein the first operation algorithm includes at least the first charge movement process type of programming by hole injection.

7. The integrated circuit device of claim 1, wherein the first operation algorithm includes at least the first charge movement process type of programming by band-to-band tunneling induced hole injection.

8. The integrated circuit device of claim 1, wherein the first operation algorithm includes at least the first charge movement process type of erasing by E-field assisted electron injection.

9. The integrated circuit device of claim 1, wherein the first operation algorithm includes at least charge movement process types of programming by hole injection, and erasing by E-field assisted electron injection.

10. The integrated circuit device of claim 1, wherein the second operation algorithm includes at least the second charge movement process type of programming by electron injection.

11. The integrated circuit device of claim 1, wherein the second operation algorithm includes at least the second charge movement process type of programming by channel electron injection.

12. The integrated circuit device of claim 1, wherein the second operation algorithm includes at least the second charge movement process type of erasing by hole injection.

13. The integrated circuit device of claim 1, wherein the second operation algorithm includes at least the second charge movement process type of erasing by band-to-band tunneling induced hole injection.

14. The integrated circuit device of claim 1, wherein the second operation algorithm includes at least charge movement process types of programming by electron injection, and erasing by hole injection.

15. The integrated circuit device of claim 1, wherein the first operation algorithm includes at least charge movement process types of programming by hole injection, and erasing by E-field assisted electron injection, and the second operation algorithm includes at least charge movement process types of programming by electron injection, and erasing by hole injection.

16. The integrated circuit device of claim 1, wherein the charge storage, non-volatile memory cells in the first memory array and in the second memory array include flash memory cells with nitride charge trapping structures.

17. The integrated circuit device of claim 1, wherein the charge storage, non-volatile memory cells in the first memory array and in the second memory array include flash memory cells with nitride charge trapping structures, and the first operation algorithm includes at least the first charge movement process type of programming by hole injection, and erasing by E-field assisted electron injection, and the second operation algorithm includes at least the second charge movement process type of programming by electron injection, and erasing by hole injection.

18. The integrated circuit device of claim 1, wherein the charge storage, non-volatile memory cells in the first memory array and in the second memory array include flash memory cells that are adapted to store two bits per memory cell.

19. The integrated circuit device of claim 1, wherein the charge storage, non-volatile memory cells in the first memory array and in the second memory array include flash memory cells that are adapted to store two bits per memory cell, and further the first operation algorithm includes at least charge movement process types of programming by hole injection, and erasing by E-field assisted electron injection, and the second operation algorithm includes at least charge movement process types of programming by electron injection, and erasing by hole injection.

20. The integrated circuit device of claim 1, wherein the controller circuitry is on the semiconductor substrate.

21. The integrated circuit device of claim 1, including an SRAM array and a user programmable processor on the semiconductor substrate coupled with the first and second memory arrays.

22. A method for manufacturing an integrated circuit device, comprising:
   providing a processor in the integrated circuit device;
   providing a random access memory in the integrated circuit device;
   providing a semiconductor substrate in the integrated circuit device;
   forming a first memory array on the substrate comprising charge storage, non-volatile memory cells, configured to store data according to a first pattern of data usage in response to a first operation algorithm using a first charge movement process type with at least one of reading, programming, and erasing the first memory array;
   forming a second memory array on the substrate comprising charge storage, non-volatile memory cells, configured to store data according to a second pattern of data usage in response to a second operation algorithm using a second charge movement process type with at least one of reading, programming, and erasing the second memory array, wherein the first and second charge movement process types are different and, wherein the charge storage, non-volatile memory cells in the first memory array have a first cell structure, and wherein the charge storage, non-volatile memory cells in the second memory array have a second cell structure which is substantially the same as the first cell structure;
   providing controller circuitry coupled to the processor, the random access memory, and the first and second memory arrays, to read, program and erase data in the first memory array and in the second memory array according to the first and second operation algorithms.

23. The method for manufacturing of claim 22, wherein forming the first memory array and forming the second memory array comprises using a set of process steps which results in simultaneously forming a first plurality of bitlines for the first memory array and a second plurality of bitlines for the second memory array, thereby simultaneously defining a first channel length of the first cell structure and a second channel length of the second cell structure, such that the second channel length is different from the first channel length.

24. The method for manufacturing of claim 22, wherein forming the first memory array comprises forming a plurality of memory cells by making a first channel terminal, a channel, and a second channel terminal in the substrate, and building charge storage structure including a first dielectric layer, a charge trapping structure and a second dielectric layer overlying the channel, and a gate terminal overlying the second dielectric layer.

25. The method for manufacturing of claim 22, wherein forming the first memory array and forming the second memory array comprises using a set of process steps which results in simultaneously forming a first plurality of bitlines for the first memory array and a second plurality of bitlines for the second memory array, and simultaneously forming a first plurality of wordlines in the first memory array and a second plurality of wordlines and a second memory array.

26. The method for manufacturing of claim 22, wherein forming the first memory array and forming the second memory array comprises using a set of process steps which results in simultaneously forming a first plurality of bitlines for the first memory array and a second plurality of bitlines for the second memory array, simultaneously forming charge storage structures for memory cells in the first memory array and in the second memory array, and simultaneously forming a first plurality of wordlines in the first memory array and a second plurality of wordlines and a second memory array.

27. The method for manufacturing of claim 22, wherein the charge storage, non-volatile memory cells in the first memory array and in the second memory array respectively comprise a first channel terminal, a channel, and a second channel terminal in the substrate, a first dielectric layer, a charge trapping structure and a second dielectric layer overlying the channel, and a gate terminal, and wherein the charge trapping structure comprises at least one of silicon nitride, $Al_2O_3$, $HfO_X$, $ZrO_X$, or other metal oxide.

28. The method for manufacturing of claim 22, wherein the first cell structure has a first channel length, and the second cell structure has a second channel length different from the first channel length.

29. The method for manufacturing of claim 22, wherein the first operation algorithm includes at least the first charge movement process type of programming by hole injection.

30. The method for manufacturing of claim 22, wherein the first operation algorithm includes at least the first charge movement process type of programming by band-to-band tunneling induced hole injection.

31. The method for manufacturing of claim 22, wherein the first operation algorithm includes at least the first charge movement process type of erasing by E-field assisted electron injection.

32. The method for manufacturing of claim 22, wherein the first operation algorithm includes at least the first charge movement process type of programming by hole injection, and erasing by E-field assisted electron injection.

33. The method for manufacturing of claim 22, wherein the second operation algorithm includes at least the second charge movement process type of programming by electron injection.

34. The method for manufacturing of claim 22, wherein the second operation algorithm includes at least the second charge movement process type of programming by channel hot electron injection.

35. The method for manufacturing of claim 22, wherein the second operation algorithm includes at least the second charge movement process type of erasing by hole injection.

36. The method for manufacturing of claim 22, wherein the second operation algorithm includes at least the second charge movement process type of erasing by band-to-band tunneling induced hole injection.

37. The method for manufacturing of claim 22, wherein the second operation algorithm includes at least charge movement process types of programming by electron injection, and erasing by hole injection.

38. The method for manufacturing of claim 22, wherein the first operation algorithm includes at least charge movement process types of programming by hole injection, and erasing by E-field assisted electron injection, and the second operation algorithm includes at least charge movement process types of programming by electron injection, and erasing by hole injection.

39. The method for manufacturing of claim 22, wherein the charge storage, non-volatile memory cells in the first memory array and in the second memory array include flash memory cells with nitride charge trapping structures, and the first operation algorithm includes at least charge movement process types of programming by hole injection, and erasing by E-field assisted electron injection, and the second operation algorithm includes at least charge movement process types of programming by electron injection, and erasing by hole injection.

40. The method for manufacturing of claim 22, wherein the charge storage, non-volatile memory cells in the first memory array and in the second memory array include flash memory cells with nitride charge trapping structures which are substantially the same.

41. The method for manufacturing of claim 22, wherein the charge storage, non-volatile memory cells in the first memory array and in the second memory array include flash memory cells with nitride charge trapping structures which are substantially the same, and further the first operation algorithm includes at least charge movement process types of programming by hole injection, and erasing by E-field assisted electron injection, and the second operation algorithm includes at least charge movement process types of programming by electron injection, and erasing by hole injection.

42. The method for manufacturing of claim 22, wherein the charge storage, non-volatile memory cells in the first memory array and in the second memory array include flash memory cells that are adapted to store two bits per memory cell.

43. The method for manufacturing of claim 22, wherein the charge storage, non-volatile memory cells in the first memory array and in the second memory array include flash memory cells that are adapted to store two bits per memory cell, and further the first operation algorithm includes at least charge movement process types of programming by hole injection, and erasing by E-field assisted electron injection, and the second operation algorithm includes at least charge movement process types of programming by electron injection, and erasing by hole injection.

44. The method for manufacturing of claim 22, including forming an SRAM array and a user programmable processor on the semiconductor substrate coupled with the first and second memory arrays.

45. A method for storing data and code on a single integrated circuit, comprising:

addressing a first memory array comprising non-volatile memory cells on the integrated circuit, to read, program and erase data;

addressing a second memory array comprising non-volatile memory cells on the integrated circuit, to read, program and erase data, wherein the charge storage, non-volatile memory cells in the first memory array have a first cell structure, and wherein the charge storage, non-volatile memory cells in the second memory array have a second cell structure which is substantially the same as the first cell structure;

reading, programming and erasing data in the first memory array according to a first operation algorithm adapted for a first pattern of data usage, using a first charge movement process type with at least one of reading, programming, and erasing the first memory array; and reading, programming and erasing code in the second memory array according to a second operation algorithm adapted for a second pattern of data usage, wherein the second operation algorithm is not the same as the first operation algorithm, using a second charge movement process type with at least one of reading, programming, and erasing the second memory array, wherein the first and second charge movement process types are different.

46. The method of claim 45, wherein the non-volatile memory cells in the first memory array and the second memory array comprise charge storage memory cells.

47. The method of claim 45, wherein the non-volatile memory cells in the first memory array and the second memory array comprise charge trapping memory cells having charge trapping structures, and wherein the charge trapping structures comprise at least one of silicon nitride, $Al_2O_3$, $HfO_x$, $ZrO_x$, or other metal oxide.

48. The method of claim 45, wherein the non-volatile memory cells in the first memory array are adapted for data storage by charge trapping, and the non-volatile memory cells in the second memory array are adapted for data storage by charge trapping.

49. The method of claim 45, wherein the first cell structure has a first channel length, and the second cell structure has a second channel length different from the first channel length.

50. The method of claim 45, wherein the first operation algorithm includes at least the first charge movement process type of programming by hole injection.

51. The method of claim 45, wherein the first operation algorithm includes at least the first charge movement process type of programming by band-to-band tunneling induced hole injection.

52. The method of claim 45, wherein the first operation algorithm includes at least the first charge movement process type of erasing by E-field assisted electron injection.

53. The method of claim 45, wherein the first operation algorithm includes at least charge movement process types of programming by hole injection, and erasing by E-field assisted electron injection.

54. The method of claim 45, wherein the second operation algorithm includes programming at least the second charge movement process type of by electron injection.

55. The method of claim 45, wherein the second operation algorithm includes at least the second charge movement process type of programming by channel hot electron injection.

56. The method of claim 45, wherein the second operation algorithm includes at least the second charge movement process type of erasing by hole injection.

57. The method of claim 45, wherein the second operation algorithm includes at least the second charge movement process type of erasing by band-to-band tunneling induced hole injection.

58. The method of claim 45, wherein the second operation algorithm includes at least charge movement process types of programming by electron injection, and erasing by hole injection.

59. The method of claim 45, wherein the first operation algorithm includes at least charge movement process types of programming by hole injection, and erasing by E-field assisted electron injection, and the second operation algorithm includes at least charge movement process types of programming by electron injection, and erasing by hole injection.

60. The method of claim 45, wherein the charge storage, non-volatile memory cells in the first memory array and in the second memory array include flash memory cells with nitride charge trapping structures, and the first operation algorithm includes at least charge movement process types of programming by hole injection, and erasing by E-field assisted electron injection, and the second operation algorithm includes at least charge movement process types of programming by electron injection, and erasing by hole injection.

61. The method of claim 45, wherein the charge storage, non-volatile memory cells in the first memory array and in the second memory array include flash memory cells with nitride charge trapping structures which are substantially the same.

62. The method of claim 45, wherein the charge storage, non-volatile memory cells in the first memory array and in the second memory array include flash memory cells with nitride charge trapping structures which are substantially the same, and further the first operation algorithm includes at least charge movement process types of programming by hole injection, and erasing by E-field assisted electron injection, and the second operation algorithm includes at least charge movement process types of programming by electron injection, and erasing by hole injection.

63. The method of claim 45, including storing two bits per memory cell in at least one of the first and second memory arrays.

64. The method of claim 45, including storing two bits per memory cell in at least one of the first and second memory arrays, and further the first operation algorithm includes at least charge movement process types of programming by hole injection, and erasing by E-field assisted electron injection, and the second operation algorithm includes at least charge movement process types of programming by electron injection, and erasing by hole injection.

* * * * *